United States Patent [19]
Gibson

[11] Patent Number: 5,075,962
[45] Date of Patent: Dec. 31, 1991

[54] METHOD FOR FORMING LEADS

[75] Inventor: William R. Gibson, San Jose, Calif.

[73] Assignee: Cypress Semiconductor Corporation, San Jose, Calif.

[21] Appl. No.: 664,670

[22] Filed: Mar. 5, 1991

[51] Int. Cl.$^5$ .............................................. H01R 43/00
[52] U.S. Cl. ........................................ 29/827; 29/593; 29/884; 206/328; 206/331; 53/471; 53/485; 361/421
[58] Field of Search ................. 29/593, 827, 882, 884; 53/467, 471, 485; 206/328, 331; 361/421

[56] References Cited

U.S. PATENT DOCUMENTS

| | | | |
|---|---|---|---|
| 3,676,926 | 7/1972 | Kendall | 29/882 |
| 4,102,039 | 7/1978 | Henrickson et al. | 29/593 |
| 4,585,121 | 4/1986 | Capelle, Jr. | 206/331 |
| 4,651,415 | 3/1987 | Frampton | 29/827 |
| 4,869,674 | 9/1989 | Pfaff | 206/328 |
| 5,022,869 | 6/1991 | Walker | 206/331 |

Primary Examiner—P. W. Echols
Attorney, Agent, or Firm—Blakely, Sokoloff, Taylor & Zafman

[57] ABSTRACT

The present invention is a method of creating a ring surrounding a chip carrier having a lead frame premolded to a carrier body or housing. The ring is comprised of a first premolded section having a first predetermined shape and a second premolded section having a second predetermined shape. A non-conductive adhesive material is applied to a mating side of each of said sections. These first and second sections are combined to form the ring in which certain portions of the first section mate into the second section through matching holes in the metal lead frame of the chip carrier package. The resulting chip carrier ring is positioned in a short distance from the carrier body relative to the length of any of the four sides of the carrier body in order to gain mechanical strength provided by the plurality of leads, thus avoiding the substantial bending of individual leads.

4 Claims, 4 Drawing Sheets

METHOD FOR FORMING LEADS

BACKGROUND OF THE INVENTION

This invention relates generally to packaging of solid state components, and more particularly, to a carrier ring for handling chip packages that are adapted for mounting on a circuit board. The invention is also directed to the method for making the carrier ring.

DESCRIPTION OF THE RELEVANT ART

The integrated circuit (IC), an electronic device that utilizes a die of semiconductor material, including thousands of transistors, diodes and other active and passive elements performing specific electronic functions has revolutionized the electronics industry and the design of consumer goods, computers business equipment, military equipment and other data processing equipment. The IC has replaced older, power-consuming vacuum tubes, single transistors and other discrete semiconductor components that were previously used to perform similar electronics functions. The IC die and its packaging have not only greatly reduced the power consumption in a circuit but have tremendously decreased the physical size of the components used in the circuit.

A die used in an integrated circuit is usually made up of a single silicon or other semiconductor substrate on which active or passive circuit elements have been fabricated using many well known semiconductor fabrication steps such as diffusion, passivation, masking, photoresist and etching. A die is not ready for use until it is packaged within a protective housing called a package, which provides external input and output terminals, called leads, to interface with other components on a circuit board.

In the past, most dice have been packaged in rectangular shaped plastic housings that have rows of leads or pins that extend outward from the bottom of the housing. The pins are usually arranged in two parallel rows extending along the length of the housing with each pin positioned near the peripheral edge of the housing. The pins are usually mounted to a circuit board by first placing the pins through pre-drilled holes located in the circuit board and then soldering the ends of the pins to the opposite side of the circuit board. This type of component, generally referred to as a dual-in-line package (DIP), has been the industry standard for many years.

Despite the popularity of dual-in-line packages due to their ruggedness and strength of their pins, engineers have been searching for alternative packaging to overcome some of the problems associated with DIPs. For example, engineers have found that DIPs which accommodate 64 or more pins consume more valuable space on circuit boards than necessary; and that as the number of pins increases, the electrical performance decreases. It is quite possible for DIPs having 64 pins or more to have pin lengths up to 1.6 inches measured from the edge of the semiconductor chip to the outermost edge of the pin. This conductive length can produce undesired parasitic inductances which cause an increase of propagation delay time through the die to the associated printed circuit board circuitry. Additionally, DIPs require the circuit board to be pre-drilled with properly spaced holes to receive the pins of the DIP.

These and other disadvantages prompted many electronic designers to look for new packaging to accommodate the die. This search for a smaller and more reliable package prompted the invention of surface mounted technology (SMT) that are generally mounted and soldered onto one side of a printed circuit board. In order to accomplish this type of mounting, the circuit board has to be printed with conductive pads or "footprints" that correspond to the spacing of the leads on the SMT. A surface mounted device is simply placed on its pads and soldered to the board. One popular SMT, referred to in the industry as a chip carrier, includes a square or rectangular housing having a central portion upon which the die or dice are mounted. The chip carrier also includes input and output pins or leads located on all four sides of the housing. Typically, the spacing between the input/output leads is 0.05 inch, half of the spacing of DIP pins. Additionally, the newer chip carrier packages can take up less than one-fourth of the area that conventional DIPs take up. Also, since the chip carrier has a smaller input/output lead, electrical performance is enhanced through lower inductances, resulting in shorter propagation delay time through the die.

Chip carriers generally come in two types, ceramic and plastic. Ceramic chip carriers, are made from ceramic materials and are generally used for military and other high reliability applications which require the hermeticity and high temperature properties of ceramics. Ceramic chip carriers are more expensive than plastic chip carriers. Plastic chip carriers are more widely used in commercial and industrial applications where the environment is less severe and the need for cost effectiveness dominates the package choice decision. One popular plastic chip carrier includes a plastic-like housing or body which carries a stamped metal lead frame. The lead frame forms numerous individual leads that are bent down around the perimeter of the housing. The leads can be formed under the housing in a shape similar to the capital letter "J". This type of lead, commonly called the J-lead, provides sufficient contact for attaching the chip carrier to a circuit board or other substrate, since the J-lead can be soldered to corresponding conductive pads located on the circuit board. Other variations of leads include gull-wing leads which extend out away from the bottom of the carrier body rather than under it.

While plastic chip carriers are advantageous in some respects over DIPs, they still possess disadvantages which have hindered their acceptance by the industry. One of the main problems encountered has been in the handling of the lead frames attached to the carrier body during testing and transporting of the IC. Since many chip carriers can have as many as 512 leads, each with a very thin dimension and a very weak mechanical strength, there has been a manufacturing yield loss due to bending and other mechanical damage to these unprotected leads. This only adds to the cost of delivering a functional IC component to the customer. Maintaining lead coplanarity (the straightness of each lead with the mounting plane during soldering) is an important specification required for mounting the chip carrier onto the circuit board. Many manufacturers specify that their components must have a coplanarity of $-/+2$ to $-/+5$ mils in order to achieve proper soldering of the carrier to the circuit board. However, during the transporting and handling of the chip carrier, it still is possible for some of the leads to become bent. When this occurs, a technician must return the bent leads to their original shape to enable the chip carrier to properly engage all its mounting pads on the printed circuit board. If the leads become bent a technician will have to take additional time and effort to fix them. Sometimes, it is impossible for the technician to properly bend the leads back into their precise original shape, thus rendering the chip carrier useless.

Attempts to resolve these bent lead problems were made in the past. Examples are disclosed in U.S. Pat. Nos. 4,701,781 and 4,102,039. These patents use a plastic ring that surrounds and is spaced apart from the IC package but mechanically connects to all the leads on all four sides of the package, thereby protecting the portion of the leads between the plastic ring and the package from damage, yet allows access for test probes used in final electrical testing of the IC. Before mounting the IC onto a circuit board, the plastic ring and the section of the leads inside the plastic ring are cut off. The chip carrier is mounted to the board by soldering the remaining section of the leads still attached to the package onto the circuit board. This plastic ring is also called a chip carrier ring.

While the '039 and '781 patents, above, provide possible solutions, the methods used to manufacture the chip carrier ring involve the use of complex and expensive dedicated manufacturing equipment. For example the manufacturing methods disclosed by both patents require an apparatus, such as a dam bar (a comb like bar), to prevent the plastic used in forming the ring from covering some of the exposed leads. This is done in order to prevent the possibility of creating an unwanted plastic insulation layer around the leads, thereby rendering them electrically untestable or mechanically unsolderable. Also the rings of these patents are only suitable for plastic packages since both the package and the chip carrier ring are molded simultaneously.

The electronics industry has not yet fully developed the concept of chip carrier ring to its full potential. Therefore, it is an object of this invention to introduce a chip carrier ring that can be manufactured inexpensively and which eliminates these and other disadvantages associated with prior art chip carrier rings.

SUMMARY OF THE INVENTION

The present invention is a chip carrier ring having a frame molded independently of the carrier body which houses the chip. The ring has a first premolded section having a first predetermined shape and a second premolded section having a second predetermined shape. A nonconductive adhesive material is applied to a mating side of each of these sections. These first and second sections are then combined to form a carrier ring in which portions of the first section mate into the second section through matching holes in the metal lead frame of the chip carrier. The metal lead frame also has metal tie bars that hold the outer edges of the leads together. The resulting chip carrier ring is positioned somewhat away from the periphery of the carrier body in order to provide mechanical support to the plurality of leads, thus avoiding bending. After trimming the tie bars the outer most portions of the leads are then bent over to fit the edge of the ring to provide test contact points.

BRIEF DESCRIPTION OF THE DRAWINGS

A complete understanding of the present invention and other advantages and features thereof may be gained from a consideration of the following description of the preferred embodiment taken in conjunction with the accompanying drawings in which.

DETAILED DESCRIPTION OF THE PREFERRED EMBODIMENTS

Figure 1:
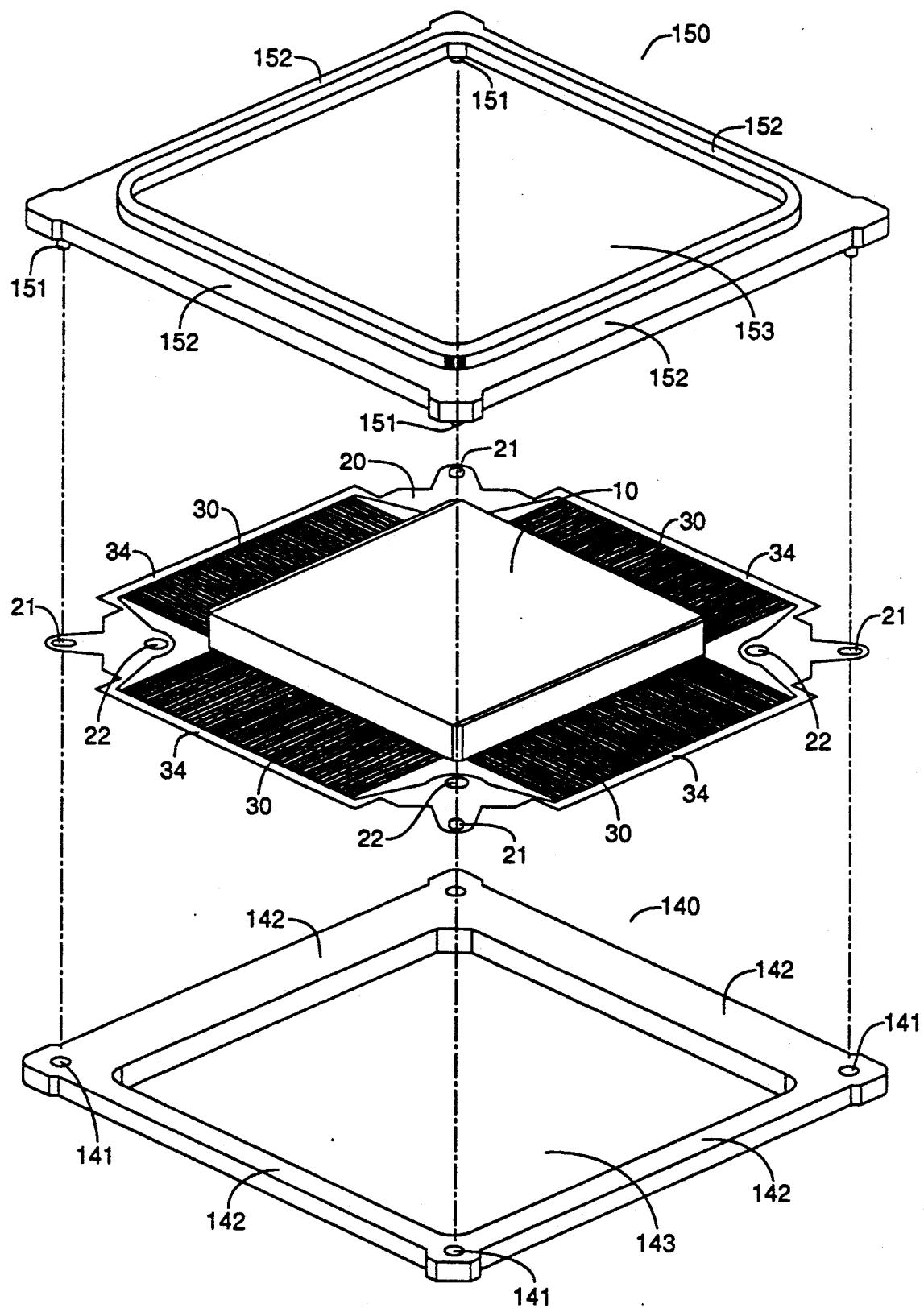
FIG. 1 is a perspective view illustrating a preferred embodiment of the present invention showing the carrier body with the extending metal lead frame and the first and second sections of the chip carrier ring.

While the present invention is susceptible of various modifications and alternative constructions, the embodiment shown in the drawings will be described in detail.

Figure 2:
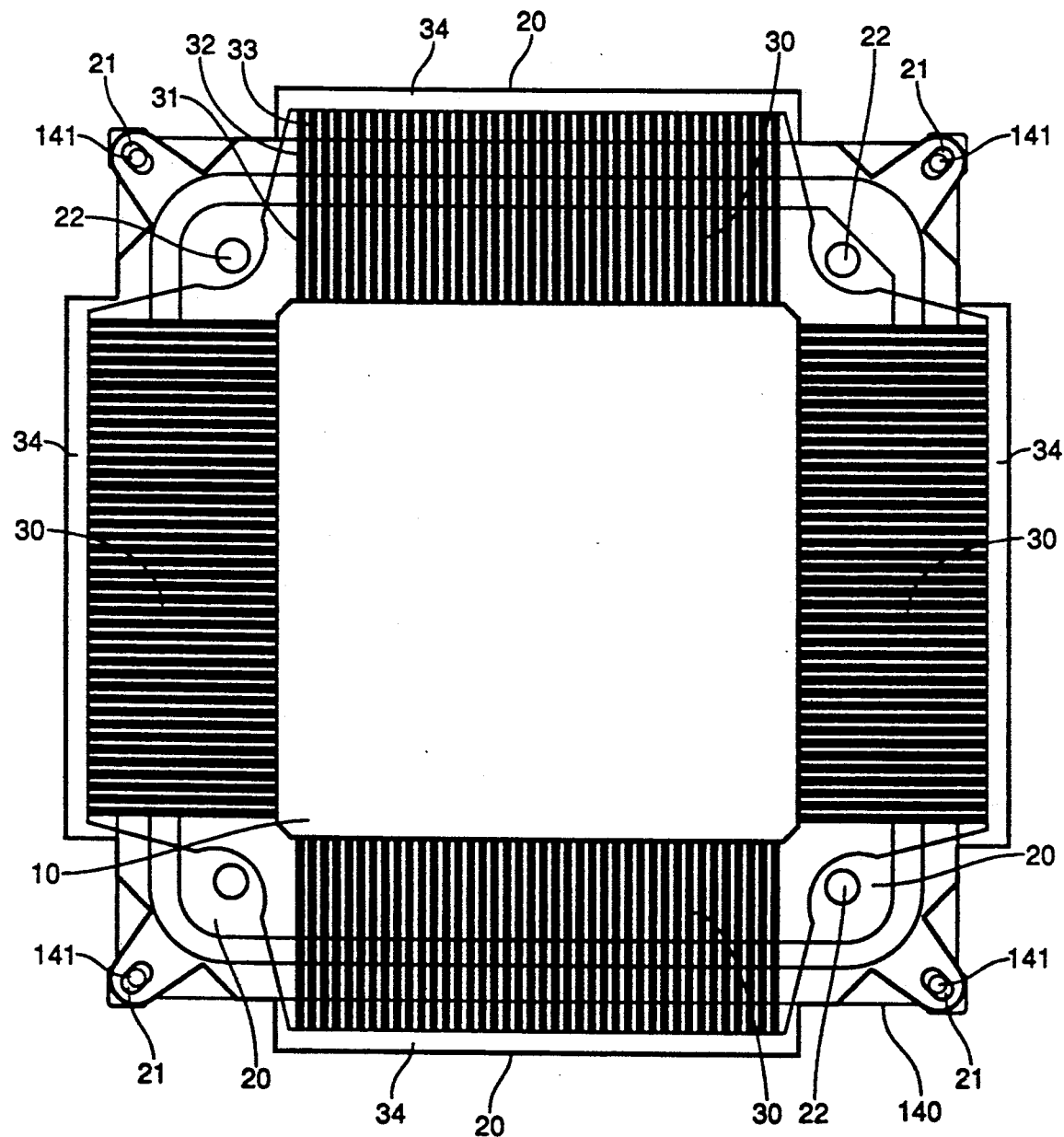
FIG. 2 is a top plan view of the chip carrier and the metal lead frame overlying the first section of the carrier ring.
Figure 3:
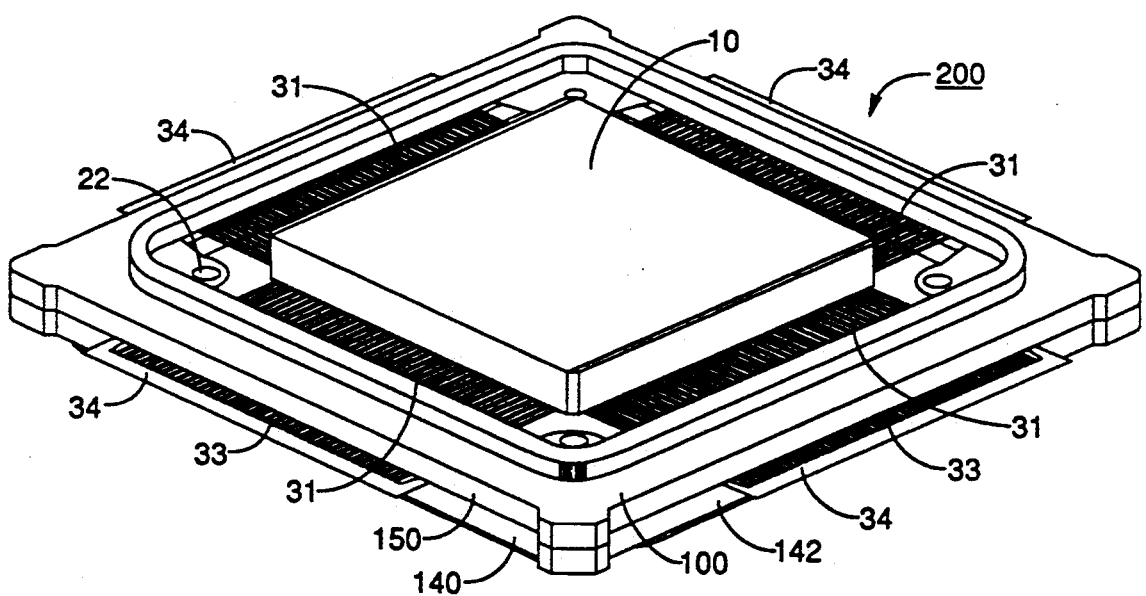
FIG. 3 illustrates the completed carrier ring surrounding the chip carrier body and attached to the metal lead frame prior to trimming of the tie bar and the bending of the outer sections of the leads.

Referring now to FIGS. 1 through 3, the construction of the carrier ring and its attachment to the lead frame of the chip carrier will be explained.

Referring to FIG. 1, the carrier body 10 is constructed upon lead frame 20 after the semiconductor die has been placed onto the lead frame and wired or soldered to the lead frame 20 in a manner well known in the art. The carrier body 10 may be plastic or ceramic as is known in the art. The lead frame may be constructed of aluminum or any other metal. In addition to the leads 30, provisions are made in the design of the lead frame 20 of this invention to include locator holes 21 and trim and form holes 22 whose roles will be explained later.

In FIG. 1 the first section of a premolded plastic carrier ring is numbered 140 and the second section is numbered 150. Ring sections 140 and 150 are typically made of a non-conductive hard plastic such as polyethersulfone (PES), so that they can withstand the high 200° C. temperatures that the IC is exposed to during burn-in testing. First ring section 140 includes four mating holes 141, four legs 142 and cavity 143. Second ring section 150 includes four mating pins 151, four legs 152 and cavity 153. The cavities 143 and 153 are designed to have the same size.

Before carrier ring sections 140 and 150 are brought together, a B-staged adhesive material such as epoxy is applied to one or both ring sections. Next the second section 150 is brought into contact with lead frame 20 by aligning mating pins 151 into locator holes 21 and passing the pins through the holes. At this point the first ring section 140 is brought into contact with lead frame 20 while aligning mating holes 141 to locator holes 21. Locator holes 21 provide mechanical support between lead frame 20 and the carrier ring in addition to minimizing radial misalignment between the ring sections 140 and 150 and the lead frame 20.

FIG. 2 is a top view of the chip carrier 10 and its lead frame 20 overlying the first section 140 of the carrier ring. Each side of lead frame 20 is extended by leads 30 from the carrier body 10. The leads 30 have three segments. The first lead segments 31 are, for example, about a quarter of an inch long. That is also the distance between the carrier body 10 and the first plastic carrier ring section 140. The second lead segments 32 come in contact with the legs 142 of the first ring section 140 and may be secured to its adhesive covered surface. Lead segments 33 extend beyond the carrier ring section 140. As can be seen in FIG. 2, metal frame segments 34 provide mechanical support to the leads prior to their being attached to the plastic carrier ring. In some applications it is possible to trim the metal frame 34 and connect test probes to the separated leads 33 for electrical testing prior to the removal of the carrier ring. In many applications, however, the lead segments remain mechanically connected by tie bars 34.

As assembled in FIG. 2, the chip carrier body 10 shown in FIG. 1 overlies most of the cavity 143 of the first ring section 140. Also trim and form holes 22 overlie the corner areas of the cavity 143.

Still referring to FIG. 1, the chip carrier ring fixture is completed by aligning the mating pins 151 of second ring section 150 to the mating holes 141 of the first section 140 and bringing the second section 150 in contact with the leads 30. The adhesive on the ring then dries and the complete ring is now formed surrounding the carrier body 10 but spaced apart from its edges by about a quarter of an inch or about 6.3 millimeter. The completed fixture 200 is shown in FIG. 3.

In a preferred embodiment of the invention, the legs 142 or 152 of the carrier ring 100 are 46 millimeters long or about seven times as long as first lead segment 31. There are forty leads on each side of the frame giving mechanical support to each other through the plastic carrier ring.

Figure 4:
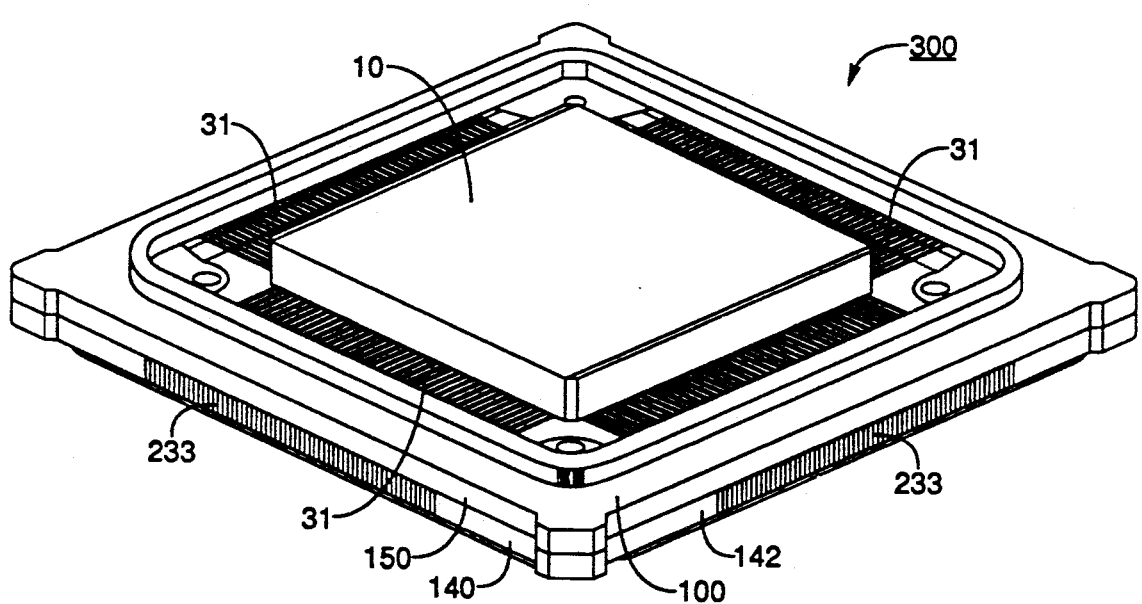
FIG. 4 illustrates the completed carrier ring surrounding the chip carrier body and attached to the metal lead frame, as it would be ready to be accepted by a test socket.

The metal tie bars 34 that connect the leads 30 on each side of the fixture 200, as shown in FIG. 3, may be trimmed off by a trimming machine that aligns to the trim and form holes 22 that are seen clearly in FIG. 2. The lead sections 33 are then bent to follow the shape of the legs 142 of the carrier ring section 140. The IC may then be electrically tested by connecting probe socket pins to the bent third segments 33 of the leads 30, which are now named test contacts points 233. The plastic ring still protects the first lead segments 31 from bending during testing. The fixture 300 shown in FIG. 4 is then ready for mounting on a circuit board and may be shipped safely to a different location for that purpose.

A trim and form machine is aligned to the trim and form holes 22 in the lead frame 20. The plastic carrier ring 100 is cut off along the interface lines between lead sections 31 and lead sections 32 shown in FIG. 2. The plastic ring is no longer required and may be discarded together with lead sections 32 and 33. Remaining lead sections 31 are then formed into any desired shape. For example in one application, a gull-wing shape was given to lead segments 31.

The chip carrier body 10 with lead segments 31 is then mounted onto a printed circuit board by soldering the lead segments 31 onto the circuit board's metal ports.

There has been illustrated and described a chip carrier ring fixture that fulfills the objects and advantages set forth above; it should be understood that many changes, modifications, variations and other uses and applications will become apparent to those skilled in the art after considering the disclosure and the accompanying drawings. For example, the ring carrier may be metal or conductive material if testing of individual leads is not required prior to its removal. Also the ring may be constructed of ceramic material. Therefore, any and all such changes, modifications, variations and other uses and applications that do not depart from the spirit and scope of the invention are deemed to be covered by the invention, which is limited only by the following claims.

What is claimed is:

1. A method of assembling electronic components comprising:
    a) providing a two-section ring having a first section and a second section, each section having (1) a cavity, (2) a rim, (3) alignment means for aligning the ring to a package containing a semiconductor device and a peripherally extending leadframe which includes leads comprising first lead segments peripherally extending from said package to said ring and second lead segments peripherally extending from said first lead segments beyond said ring, and (4) means for connecting said first and second sections together with said package and leadframe;
    b) placing said package and leadframe on one side of said first section, said package overlying said cavity and said leadframe overlying said rim of said first section;
    c) joining said first section, said second section and said semiconductor device and leadframe into a single integrated unit using said alignment means such that said first and second sections are aligned with each other and engage said leadframe without substantially altering the shape of said leadframe; and
    d) then separating said ring from said leadframe along the interface between said first and second lead segments, thereby forming connecting leads.

2. The method of claim 1 wherein said means for connecting said first section of said ring are inserted into said means for connecting said second section of said ring and become an inseparable integral part of said package.

3. The method of claim 1 where said means for connecting said first and second sections of said ring comprise mating pins and mating holes which become inseparable upon engagement.

4. The invention of claim 1 where said first section and second section engage said leadframe using adhesive material to form an integral ring.

* * * * *